United States Patent
Tang et al.

[11] Patent Number: 6,148,833
[45] Date of Patent: Nov. 21, 2000

[54] CONTINUOUS CLEANING MEGASONIC TANK WITH REDUCED DUTY CYCLE TRANSDUCERS

[75] Inventors: Jianshe Tang, Cupertino; Brian J. Brown, Palo Alto; Boris Fishkin, San Carlos, all of Calif.

[73] Assignee: Applied Materials, Inc., Santa Clara, Calif.

[21] Appl. No.: 09/191,058

[22] Filed: Nov. 11, 1998

[51] Int. Cl.[7] ............................................. B08B 3/12
[52] U.S. Cl. ............................ 134/184; 134/186; 134/902
[58] Field of Search .................................... 134/157, 184, 134/186, 902, 200, 1, 1.3; 366/113, 114, 127; 68/355

[56] References Cited

U.S. PATENT DOCUMENTS

| | | |
|---|---|---|
| 2,891,176 | 6/1959 | Branson . |
| 2,985,003 | 5/1961 | Gelfand et al. . |
| 2,987,068 | 6/1961 | Branson . |
| 3,056,589 | 10/1962 | Daniel . |
| 3,371,233 | 2/1968 | Cook . |
| 3,640,295 | 2/1972 | Peterson ................................. 134/1 |
| 4,167,424 | 9/1979 | Jubenville et al. ..................... 134/1 |
| 4,170,241 | 10/1979 | Clapp ..................................... 134/83 |
| 4,543,130 | 9/1985 | Schwartzman ......................... 134/1 |
| 4,686,406 | 8/1987 | Meitzler ............................... 310/322 |
| 4,736,760 | 4/1988 | Coberly et al. ..................... 134/134 |
| 4,836,684 | 6/1989 | Javorik et al. ....................... 366/114 |
| 4,886,082 | 12/1989 | Kato et al. ............................. 134/60 |
| 4,909,266 | 3/1990 | Massa .................................... 134/60 |
| 5,038,808 | 8/1991 | Hammond et al. ................... 134/184 |
| 5,090,432 | 2/1992 | Bran ...................................... 134/139 |
| 5,133,376 | 7/1992 | Samarin et al. ..................... 134/184 |
| 5,247,954 | 9/1993 | Grant et al. . |
| 5,279,316 | 1/1994 | Miranda . |
| 5,379,785 | 1/1995 | Ohmori et al. ....................... 134/184 |
| 5,383,484 | 1/1995 | Thomas et al. ....................... 134/184 |
| 5,625,249 | 4/1997 | Grant . |
| 5,672,212 | 9/1997 | Manos .................................. 134/1.3 |
| 5,681,396 | 10/1997 | Madanshetty . |
| 5,727,578 | 3/1998 | Matthews ............................... 134/61 |
| 5,762,084 | 6/1998 | Krusell et al. ....................... 134/184 |
| 5,813,074 | 9/1998 | Liljeholm ............................. 15/21.1 |

FOREIGN PATENT DOCUMENTS

| | | | |
|---|---|---|---|
| 1-304733 | 12/1989 | Japan ..................................... 134/902 |
| 10323635 | 8/1998 | Japan . |

*Primary Examiner*—Frankie L. Stinson
*Attorney, Agent, or Firm*—Dugan & Dugan

[57] ABSTRACT

A sonic tank for cleaning substrates is provided. The tank has two or more upwardly angled walls. Arrays of one or more transducers are positioned along at least two of the two or more angled walls. The transducer arrays are alternately energized maintaining nearly 100% substrate surface cleaning at any given time, and 50% duty cycle (or less) for each transducer array. The substrate supports are positioned such that nearly every point along the substrate's surface is contacted by energy from at least one transducer, and transducer opposing walls are positioned to avoid interfering reflections therefrom.

30 Claims, 1 Drawing Sheet

CONTINUOUS CLEANING MEGASONIC TANK WITH REDUCED DUTY CYCLE TRANSDUCERS

FIELD OF THE INVENTION

The present invention relates generally to apparatuses and methods for cleaning thin discs or substrates, such as semiconductor wafers, compact discs, glass substrates, flat panel displays and the like. More particularly, the invention relates to a megasonic tank for cleaning semiconductor wafers.

BACKGROUND OF THE INVENTION

Conventional megasonic cleaning tanks employ a fluid filled tank having substrate supports therein and a source of megasonic energy, (e.g., a transducer) coupled to the fluid for directing sonic energy through the fluid to the surfaces of a substrate or wafer supported therein. During megasonic cleaning, the transducer oscillates between a positive and a negative position at a megasonic rate so as to generate positive and negative pressures within the fluid, and thereby couple megasonic energy to the fluid. As the energy imparted to the fluid oscillates between positive and negative pressure, cavitation bubbles form in the fluid during negative pressure and collapse or shrink during positive pressure. This bubble oscillation and collapse gently cleans the surface of the wafer.

Particles cleaned from the wafer are carried upward via a laminar flow of fluid and flushed into overflow weirs coupled to the top of the cleaning tank. Thus, a supply of clean fluid is continually introduced into the cleaning tank from the bottom of the sidewalls thereof. Cleaning fluid distribution nozzles are positioned along the bottom of the sidewalls to supply various cleaning fluids through the same nozzles or through dedicated sets of nozzles.

Most conventional cleaning tanks position one or more transducers along the bottom of the cleaning tank. Acoustic waves from these transducers reflect from the surface of the cleaning fluid back into transducers, and interference results in reduced power density in the tank and reduced cleaning efficiency. Due to the limited area of the tank's bottom, the number, size, placement and shape of the transducers, fluid inlets, etc., often can not be freely selected for optimal performance.

In practice, megasonic cleaners experience a number of other limitations as well. For instance, transducers with higher power density assure better cleaning efficiency, but generate considerable heat during operation. Accordingly, cooling systems are often used to prevent degradation of adhesive material that attaches a transducer to materials that couple the transducer's acoustic power to the cleaning fluid and to prevent overheating of the power supply that could reduce the life of its electrical components. Such transducer cooling systems, however, undesirably increase the cost and complexity of a megasonic cleaning system.

An alternative approach has been to employ a cycled array of multiplexed transducers in which each transducer is on only 1/Nth of the cycle time, where N is the number of transducers per cleaning vessel. The reduction of duty cycle by a factor of N, which is usually 8 for 8 inch wafer batch processing vessels, reduces transducer temperatures and in some cases eliminates the need for transducer cooling systems. A major problem of this approach is the often unacceptable increase in processing time by a factor of N. The increase in processing time is particularly problematic for single wafer processing, where short processing time is an important requirement.

Another problem experienced by megasonic cleaners is the shadowing of the transducer's acoustic field by the wafer supports on which a wafer is positioned. Because a support must be positioned below the wafer to stabilize the wafer, the supports directly block energy transmitted from transducers positioned below the wafer.

Accordingly, a need exists for an improved sonic cleaning tank that provides high laminar fluid flow yet avoids the interference of incident and reflected waves, maintains short processing times without requiring transducer cooling arrangements, and minimizes shadowing by substrate supports.

SUMMARY OF THE INVENTION

The present invention overcomes the shortcomings of the prior art by providing a sonic cleaning tank in which transducer arrays face the substrate from a plurality of angles, and are switched on and off alternately to provide cleaning energy across the entire surface of the substrate at any given time, yet enabling each transducer to experience a reduced duty cycle. The tank walls to which the transducers attach are angled upward and the tank is designed such that walls (if any) are positioned opposite a transducer so that energy reflected therefrom does not cross the surface of the substrate being cleaned (i.e., the walls are positioned for non-interfering reflection). Preferably, the lower side walls or the bottom wall of the cleaning tank are angled upward forming two or more upwardly angled walls. Arrays of one or more transducers are positioned along at least two of the two or more upwardly angled walls. Each transducer array is equal to or greater in length than the diameter of the substrate being cleaned so that alternately energizing the two or more transducer arrays provides nearly 100% cleaning across the substrate's surface, yet requires only a 50% (or less depending on the number of transducer arrays) duty cycle for each transducer. Thus, the inventive arrangement is far superior to any known sonic tank-type cleaner.

Not only does the invention provide fast processing times (due to nearly 100% surface cleaning at any given time) and enable transducers and power supplies to last longer (due to reduced duty cycles) without the aid of complex cooling systems, the invention reduces or eliminates both substrate shadowing and interference from energy waves reflected back toward the transducer. Because each transducer array faces the substrate from a unique angle, substrate support shadowing can be eliminated with appropriate substrate support placement. For instance, by employing two side substrate supports and one bottom substrate support, and by positioning the bottom substrate support along the baricenter of the substrate, the bottom support will not shadow the same region of the substrate from the energy of both transducer arrays.

Similarly, because the energy from the two transducer arrays approaches the substrate from opposing directions, the two side supports can be positioned so as not to cause shadowing by blocking energy from the transducer array opposite thereto, e.g., by positioning the side supports along opposite sides of the substrate's horizontal diameter. It will be understood that the portion of the substrate which is contacted by the substrate support will be blocked continuously from transducer energy. Thus, as used herein, shadowing refers to the blocking of transducer energy from those portions of the substrate which are not in contact with a substrate support.

Further, the inventive cleaning tank is advantageously configured such that any transducer energy which travels across the substrate, impacts an opposing sidewall, and reflects therefrom will travel upwardly to the air/liquid interface without crossing the substrate, and without interfering with the cleaning of the substrate's surface (i.e., in a non-interfering manner). This is achieved by employing transducer arrays positioned on the upwardly angled walls, as will be understood with reference to the drawings provided herein. In a further embodiment, rotating the substrate causes each portion of the substrate's beveled edge to pass through the regions of highest intensity cleaning, i.e., the regions closest to a transducer array, for example closest to the first transducer array, and closest to the second transducer array. Because a single rotation causes the substrate to pass through two or more high intensity cleaning regions, superior edge cleaning is achieved.

Accordingly the invention eliminates many of the parts required by conventional sonic cleaning tanks, prevents substrate shadowing, prevents interfering reflection and lengthens transducer life by reducing duty cycle, but does so without increasing processing time. Other objects, features and advantages of the present invention will become more fully apparent from the following detailed description of the preferred embodiments, the appended claims and the accompanying drawings.

DETAILED DESCRIPTION OF THE PREFERRED EMBODIMENTS

Figure 1:
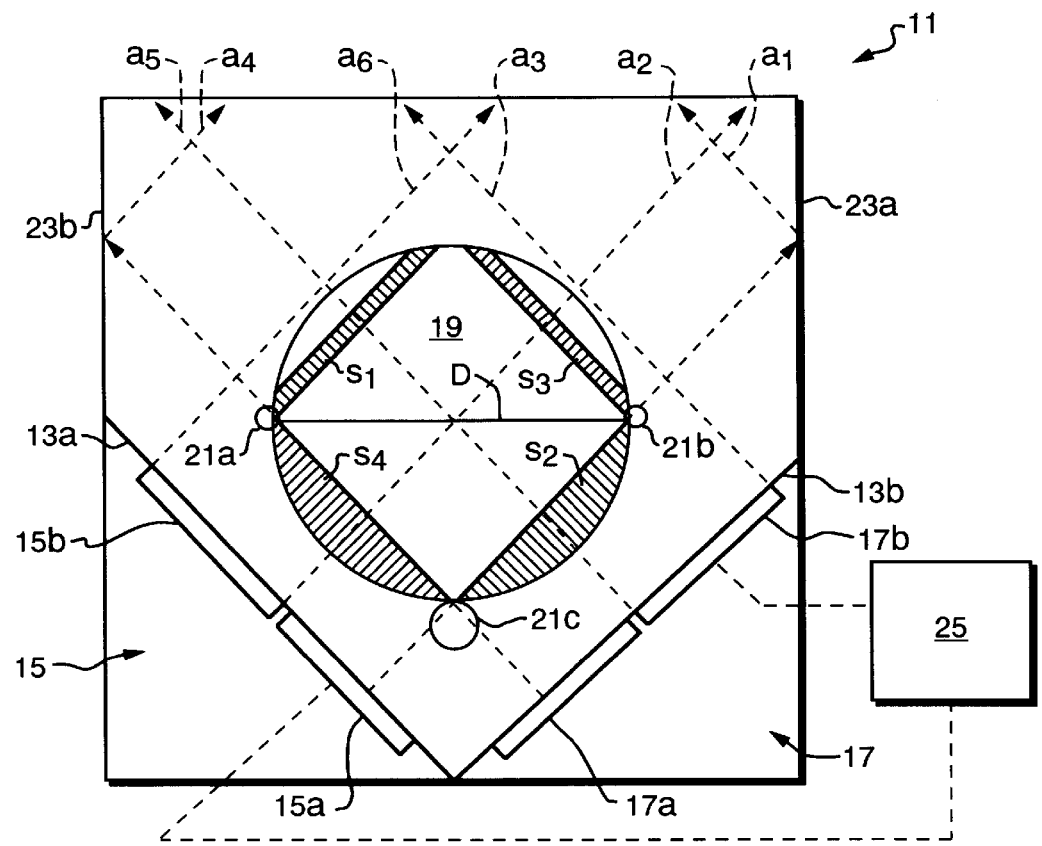
FIG. 1 is a schematic front elevational view of a preferred embodiment of an inventive cleaning tank configured in accordance with the present invention.
Figure 2:
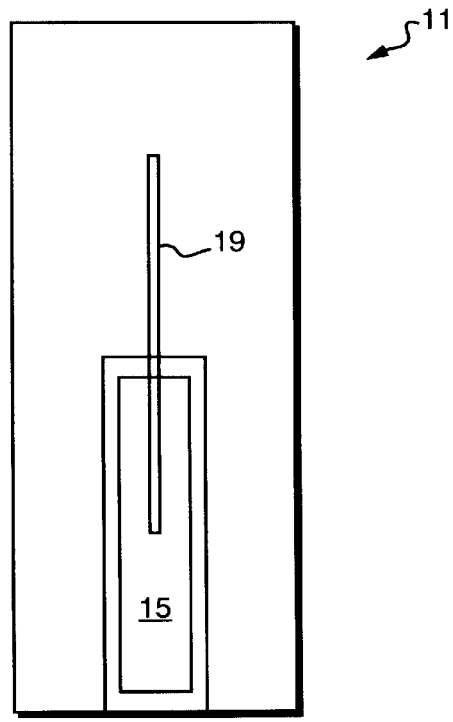
FIG. 2 is a schematic side elevational view of the inventive cleaning tank of FIG. 1.

FIGS. 1 and 2 are a schematic front elevational view and a schematic side elevational view, respectively, of an inventive cleaning tank 11 configured in accordance with the present invention. The cleaning tank 11 comprises a first upwardly angled bottom wall 13a and a second upwardly angled bottom wall 13b, which join at a point P. As shown in FIG. 1 the first and second upwardly angled walls form a 90° angle, however, they may form angles greater or less than 90°. A first transducer array 15 is operatively coupled to the first angled bottom wall 13a, and a second transducer array 17 is operatively coupled to the second angled bottom wall 13b. Each transducer array may comprise one or more transducers. As shown in FIG. 1 the first transducer array 15 comprises a first transducer 15a and a second transducer 15b, and the second transducer array 17 comprises a first transducer 17a and a second transducer 17b.

The cleaning tank 11 is designed for cleaning a semiconductor wafer 19 having a diameter D. Thus, each transducer array 15, 17, extends a length equal to or greater than the diameter D of the semiconductor wafer 19, so that each transducer array cleans nearly 100% of the substrate. As used herein, nearly 100% surface cleaning means cleaning all surfaces not shadowed by or in direct contact with the substrate support. The cleaning tank 11 further comprises a substrate support comprising two side supports 21a, 21b and a bottom support 21c. The side supports 21a, 21b are positioned to contact the semiconductor wafer 19 along opposite sides thereof, and are designed to support the wafer with minimal contact. The bottom support 21c is positioned to contact the wafer along its baricenter, with minimal contact. Each substrate support 21a–c is small in size so as to produce minimal shadowing.

The cleaning tank 11 further comprises a first wall 23a positioned to receive direct energy (i.e., unreflected energy) from the first transducer array 15 and to reflect the energy in a non-interfering manner (so as not to interfere with the cleaning of the wafer's surface), and a second wall 23b positioned to receive direct energy from the second transducer array 17 and to reflect the energy in a non-interfering manner.

A controller 25 is operatively coupled to the first transducer array 15 and to the second transducer array 17 to alternately energize the first transducer array 15 and the second transducer array 17. The controller 25 may also be operatively coupled to any of the side or the bottom substrate supports so as to cause rotation thereof, and to thereby rotate the semiconductor wafer 19.

In operation, the cleaning tank 11 is filled with a cleaning fluid such as deionized water. The semiconductor wafer 19 is placed on the substrate support 21a–c, and the controller 25 energizes the first transducer array 15. The first transducer array 15 oscillates at a megasonic rate causing bubbles to form in the cleaning fluid. The bubbles clean the surface of the semiconductor wafer 19, as is known in the art (i.e., the first transducer array 15 outputs cleaning energy). The cleaning energy output by the first transducer array 15 travels across the surface of the semiconductor wafer 19, cleaning the surface of the semiconductor wafer 19. Because the first transducer array 15 extends a length at least equal to the diameter D of the semiconductor wafer 19, nearly the entire surface of the semiconductor wafer 19 is cleaned by the energy from the first transducer array 15. Minimal shadowing however, is caused by the side support 21a and by the bottom support 21c as represented by the shaded regions $S_1$ and $S_2$.

After passing the semiconductor wafer 19 the energy from the first transducer 15a of the first transducer array 15 impacts the first wall 23a and is reflected therefrom upward to the air/liquid interface, as represented by the arrows $a_1$ and $a_2$. The air/liquid interface reflects the energy back into the tank in a scattered manner, so that the reflected energy does not interfere with substrate cleaning. Similarly, after passing the semiconductor wafer 19, the energy from the second transducer 15b of the first transducer array 15 travels to the air/liquid interface of the cleaning tank 11 as represented by the arrow $a_3$.

After a predetermined period of time (e.g., 1 msec. to 2.0 sec.) the controller 25 simultaneously de-energizes the first transducer array 15 and energizes the second transducer array 17. The second transducer array 17 outputs megasonic cleaning energy in the direction of the semiconductor wafer 19. The cleaning energy travels across the surface of the semiconductor wafer 19, thereby cleaning the semiconductor wafer 19's surface. Because the first transducer array 15 extends a length at least equal to the diameter D of the semiconductor wafer 19, nearly the entire surface of the semiconductor wafer 19 is cleaned by the energy from the second transducer array 17. Minimal shadowing however, is caused by the side support 21b and by the bottom support 21c, as represented by the shaded regions $S_3$ and $S_4$.

After passing the semiconductor wafer 19 the energy from the first transducer 17a of the second transducer array 17 impacts the second wall 23b and is reflected therefrom upward to the air/liquid interface of the cleaning tank 11, as represented by the arrows $a_4$ and $a_5$. Similarly, after passing the semiconductor wafer 19 the energy from the second transducer 17b of the second transducer array 17 travels to the air/liquid interface of the cleaning tank 11 as represented by the arrow $a_6$. As shown by the arrows $a_{1-6}$ the first and second walls 23a, 23b are positioned to receive direct cleaning energy and to reflect it in a non-interfering manner so that the reflected energy does not cross the surface of the semiconductor wafer 19 and interfere with cleaning of the semiconductor wafer 19's surface. The controller 25 continues to alternately energize the first transducer array 15 and the second transducer array 17 every one second for a predetermined period of time that provides adequate cleaning (e.g., 30 to 600 sec).

The controller 25 also may be programmed to rotate the side support 21a, the side support 21b and/or the bottom support 21c during cleaning of the semiconductor wafer 19. Rotation of the substrate support 21a–c causes the semiconductor wafer 19 to rotate, causing each location along the semiconductor wafer 19's beveled edge to pass through the two highest intensity cleaning regions (the regions closest the first transducer array 15 and closest the second transducer array 17) during each revolution of the semiconductor wafer 19. Accordingly, rotation of the semiconductor wafer 19 provides superior edge cleaning. In order for the substrate support 21a–c to maintain sufficient contact with the semiconductor substrate 19 to rotate the semiconductor substrate 19, the side substrate supports 21a, 21b each are preferably positioned slightly below (e.g., 10° below) the horizontal diameter D of the semiconductor wafer 19. Such positioning will cause some shadowing of the semiconductor wafer 19, however, rotation ensures that each portion of the semiconductor wafer 19 is cleaned.

The foregoing description discloses only the preferred embodiments of the invention, modifications of the above disclosed apparatus and method which fall within the scope of the invention will be readily apparent to those of ordinary skill in the art. For instance, although the tank of FIG. 1 employs two upwardly angled bottom walls, an upwardly angled wall may comprise part of a side wall or an entire side wall. The cleaning tank may have more than two upwardly angled walls, and more than two of the upwardly angled walls may have transducer arrays coupled thereto. Although systems having a greater number of transducer arrays experience lower duty cycles per transducer, two angled bottom walls and two transducer arrays are preferred for minimizing tank size, and for minimizing system cost and complexity. Similarly, more than two side walls may be positioned opposite the transducers. The side walls opposite the transducers may be angled outward and still achieve the desired non-interfering reflection. In fact, embodiments that submerge only half of the substrate may be employed, in which case the side walls may be omitted allowing energy to travel directly to the air/liquid interface. Such embodiments would rotate the substrate to achieve cleaning across the entire surface of the substrate with minimal cleaning fluid consumption. Further, each transducer array may contain any number of transducers. As used herein, a substrate or a wafer includes, but is not limited to a semiconductor wafer with or without material layers thereon, whether patterned or unpatterned.

Accordingly, while the present invention has been disclosed in connection with the preferred embodiments thereof, it should be understood that other embodiments may fall within the spirit and scope of the invention, as defined by the following claims.

What is claimed is:

1. A sonic cleaning tank for cleaning a thin disk comprising:
    at least two upwardly angled walls;
    a first transducer array comprising at least one transducer operatively coupled to a first one of the upwardly angled walls, and extending a distance at least equal to the length of a thin disk to be cleaned thereby; and
    a second transducer array comprising at least one transducer operatively coupled to a second one of the upwardly angled walls, and extending a distance at least equal to the length of a thin disk to be cleaned thereby;
    a first wall positioned to receive direct energy from the first transducer array and to reflect in a non-interfering manner the energy received from the first transducer array; and
    a second wall positioned to receive direct energy from the second transducer array and to reflect in a non-interfering manner the energy received from the second transducer array.

2. The apparatus of claim 1 further comprising a thin disk support for contacting the thin disk at two or more points, the thin disk support being positioned so as not to shadow the same region of the thin disk from the energy of both the first transducer array and the second transducer array.

3. The apparatus of claim 2 wherein the thin disk support comprises two side supports positioned along opposite sides of the thin disk so as not to shadow the same region of the thin disk from the energy of both the first transducer array and the second transducer array, and one bottom support positioned along the thin disk's baricenter so as not to shadow the same region of the thin disk from the energy of both the first transducer array and the second transducer array.

4. The apparatus of claim 1 wherein the at least two upwardly angled walls includes only two upwardly angled walls.

5. The apparatus of claim 4 wherein the first upwardly angled wall and the second upwardly angled wall are bottom walls which join forming a 90° angle.

6. The apparatus of claim 5 further comprising a thin disk support comprising two side supports positioned along opposite sides of the thin disk so as not to shadow the same region of the thin disk from the energy of both the first transducer array and the second transducer array, and one bottom support positioned along the thin disk's baricenter so as not to shadow the same region of the thin disk from the energy of both the first transducer array and the second transducer array.

7. The apparatus of claim 1 wherein the first transducer array includes a first and a second transducer;
    the second transducer array includes a first and a second transducer; and
    wherein the apparatus further comprises a rotatable thin disk support for rotating the thin disk.

8. The apparatus of claim 1 further comprising a controller for individually energizing the first and the second transducer arrays.

9. The apparatus of claim 8 wherein the controller is programmed to individually energize the first and the second transducer arrays such that only one transducer array is energized at any given time.

10. The apparatus of claim 1 wherein the thin disk support is rotatable so as to rotate a thin disk positioned thereon.

11. A sonic cleaning tank for cleaning a substrate comprising:
    at least two upwardly angled walls;
    a first transducer array comprising at least one transducer operatively coupled to a first one of the upwardly angled walls, and extending a distance at least equal to the length of a substrate to be cleaned thereby;

a second transducer array comprising at least one transducer operatively coupled to a second one of the upwardly angled walls, and extending a distance at least equal to the length of a substrate to be cleaned thereby;

wherein the first upwardly angled wall and the second upwardly angled wall are bottom walls which join forming a 90° angle; and a substrate support comprising two side supports positioned along opposite sides of the substrate so as not to shadow the same region of the substrate from the energy of both the first transducer array and the second transducer array, and one bottom support positioned along the substrate's baricenter so as not to shadow the same region of the substrate from the energy of both the first transducer array and the second transducer array.

12. A sonic cleaning tank for cleaning a substrate comprising:

at least two upwardly angled walls;

a first transducer array comprising at least one transducer operatively coupled to a first one of the upwardly angled walls, and extending a distance at least equal to the length of a substrate to be cleaned thereby;

a second transducer array comprising at least one transducer operatively coupled to a second one of the upwardly angled walls, and extending a distance at least equal to the length of a substrate to be cleaned thereby;

a controller for individually energizing the first and the second transducer arrays;

wherein the controller is programmed to individually energize the first and the second transducer arrays such that only one transducer array is energized at any given time; and a substrate support adapted to support the substrate and positioned so as not to shadow the same region of the substrate from the energy of both the first transducer array and the second transducer array.

13. The apparatus of claim 12 wherein the substrate support is adapted to contact the substrate at two or more points, the substrate support being positioned so as not to shadow the same region of the substrate from the energy of both the first transducer array and the second transducer array.

14. The apparatus of claim 12 wherein the substrate support comprises two side supports positioned along opposite sides of the substrate so as not to shadow the same region of the substrate from the energy of both the first transducer array and the second transducer array, and one bottom support positioned along the substrate's baricenter so as not to shadow the same region of the substrate from the energy of both the first transducer array and the second transducer array.

15. The apparatus of claim 12 further comprising a first wall positioned to receive direct energy from the first transducer array and to reflect in a non-interfering manner the energy received from the first transducer array, and a second wall positioned to receive direct energy from the second transducer array and to reflect in a non-interfering manner the energy received from the second transducer array.

16. The apparatus of claim 12 wherein the at least two upwardly angled walls includes only two upwardly angled walls.

17. The apparatus of claim 12 wherein the first upwardly angled wall and the second upwardly angled wall are bottom walls which join forming a 90° angle.

18. The apparatus of claim 12 wherein the substrate support comprises two side supports positioned along opposite sides of the substrate so as not to shadow the same region of the substrate from the energy of both the first transducer array and the second transducer array, and one bottom support positioned along the substrate's baricenter so as not to shadow the same region of the substrate from the energy of both the first transducer array and the second transducer array.

19. The apparatus of claim 12 wherein the first transducer array includes a first and a second transducer;

the second transducer array includes a first and a second transducer; and wherein the apparatus further comprises a rotatable substrate support for rotating the substrate.

20. The apparatus of claim 12 wherein the lower portions of the two upwardly angled walls are closer together than are the upper portions of the two upwardly angled walls.

21. An apparatus for cleaning a thin disk comprising:

a tank having:

at least two upwardly angled walls;

a first transducer array comprising at least one transducer operatively coupled to a first one of the upwardly angled walls;

a second transducer array comprising at least one transducer operatively coupled to a second one of the upwardly angled walls;

wherein the tank and the transducer arrays are configured to avoid interfering reflection; and a thin disk support adapted to support the thin disk and positioned along at least one side of the thin disk so as not to shadow the same region of the thin disk from the energy of both the first transducer array and the second transducer array.

22. The apparatus of claim 21 further comprising a controller for individually energizing the first and second transducer arrays.

23. The apparatus of claim 21 wherein the thin disk support comprises two side supports positioned along opposite sides of the thin disk so as not to shadow the same region of the thin disk from the energy of both the first transducer array and the second transducer array.

24. The apparatus of claim 23 further comprising one bottom support positioned along the thin disk's baricenter so as not to shadow the same region of the thin disk from the energy of both the first transducer array and the second transducer array.

25. A sonic cleaning tank for cleaning a substrate comprising:

at least two upwardly angled walls;

a first transducer array comprising at least one transducer operatively coupled to a first one of the upwardly angled walls, and extending a distance at least equal to the length of a substrate to be cleaned thereby;

a second transducer array comprising at least one transducer operatively coupled to a second one of the upwardly angled walls, and extending a distance at least equal to the length of a substrate to be cleaned thereby;

a controller for individually energizing the first and the second transducer arrays;

wherein the controller is programmed to individually energize the first and the second transducer arrays such that only one transducer array is energized at any given time; and a substrate support for contacting the substrate at two or more points, the substrate support being positioned so as not to shadow the same region of the substrate from the energy of both the first transducer array and the second transducer array.

26. The apparatus of claim 25 wherein the substrate support comprises two side supports positioned along opposite sides of the substrate so as not to shadow the same region of the substrate from the energy of both the first transducer array and the second transducer array, and one bottom support positioned along the substrate's baricenter so as not to shadow the same region of the substrate from the energy of both the first transducer array and the second transducer array.

27. A sonic cleaning tank for cleaning a substrate comprising:
- at least two upwardly angled walls;
- a first transducer array comprising at least one transducer operatively coupled to a first one of the upwardly angled walls, and extending a distance at least equal to the length of a substrate to be cleaned thereby;
- a second transducer array comprising at least one transducer operatively coupled to a second one of the upwardly angled walls, and extending a distance at least equal to the length of a substrate to be cleaned thereby;
- a controller for individually energizing the first and the second transducer arrays;
- wherein the controller is programmed to individually energize the first and the second transducer arrays such that only one transducer array is energized at any given time;
- a first wall positioned to receive direct energy from the first transducer array and to reflect in a non-interfering manner the energy received from the first transducer array; and
- a second wall positioned to receive direct energy from the second transducer array and to reflect in a non-interfering manner the energy received from the second transducer array.

28. A sonic cleaning tank for cleaning a substrate comprising:
- at least two upwardly angled walls;
- a first transducer array comprising at least one transducer operatively coupled to a first one of the upwardly angled walls, and extending a distance at least equal to the length of a substrate to be cleaned thereby;
- a second transducer array comprising at least one transducer operatively coupled to a second one of the upwardly angled walls, and extending a distance at least equal to the length of a substrate to be cleaned thereby;
- a controller for individually energizing the first and the second transducer arrays;
- wherein the controller is programmed to individually energize the first and the second transducer arrays such that only one transducer array is energized at any given time; and
- a substrate support comprising two side supports positioned along opposite sides of the substrate so as not to shadow the same region of the substrate from the energy of both the first transducer array and the second transducer array, and one bottom support positioned along the substrate's baricenter so as not to shadow the same region of the substrate from the energy of both the first transducer array and the second transducer array.

29. An apparatus for cleaning a thin disk comprising:
- a tank having:
  - at least two upwardly angled walls;
- a first transducer array comprising at least one transducer operatively coupled to a first one of the upwardly angled walls;
- a second transducer array comprising at least one transducer operatively coupled to a second one of the upwardly angled walls;
- wherein the tank and the transducer arrays are configured to avoid interfering reflection; and
- a thin disk support comprising two side supports positioned along opposite sides of the thin disk so as not to shadow the same region of the thin disk from the energy of both the first transducer array and the second transducer array.

30. The apparatus of claim 29 further comprising one bottom support positioned along the thin disk's baricenter so as not to shadow the same region of the thin disk from the energy of both the first transducer array and the second transducer array.

* * * * *